United States Patent [19]
Ziarati

[11] Patent Number: 5,432,544
[45] Date of Patent: * Jul. 11, 1995

[54] MAGNET ROOM DISPLAY OF MRI AND ULTRASOUND IMAGES

[75] Inventor: Mokhtar Ziarati, North Hollywood, Calif.

[73] Assignee: Susana Ziarati, North Hollywood, Calif.

[ * ] Notice: The portion of the term of this patent subsequent to May 2, 2012 has been disclaimed.

[21] Appl. No.: 997,957

[22] Filed: Dec. 21, 1992

Related U.S. Application Data

[63] Continuation-in-part of Ser. No. 653,711, Feb. 11, 1991.

[51] Int. Cl.⁶ .............................................. H04N 7/18
[52] U.S. Cl. ....................................... 348/61; 348/77; 324/318; 128/653.2
[58] Field of Search .................. 358/93, 22, 901, 108, 358/110, 112; H04N 7/18; 324/300, 307, 308, 309, 318, 319; 128/653.2, 653.3; 348/61, 77, 162

[56] References Cited

U.S. PATENT DOCUMENTS

| | | | |
|---|---|---|---|
| 4,855,910 | 8/1989 | Bohning | 324/309 |
| 4,910,141 | 2/1990 | Costello | 358/93 |
| 5,022,397 | 6/1991 | Dumoulin | 324/306 |
| 5,076,275 | 12/1991 | Bechor et al. | 128/653.2 |
| 5,172,103 | 12/1992 | Kita | 358/22 |
| 5,184,074 | 2/1993 | Kaufman et al. | 324/318 |

Primary Examiner—James J. Groody
Assistant Examiner—Michael H. Lee
Attorney, Agent, or Firm—Roberts and Quiogue

[57] ABSTRACT

A display system for display of MRI, ultrasonic, patient vital sign or other imagery within a magnet room of an MRI system. An MRI compatible video display is disposed with the magnet room, and is connected to the MRI image processor to provide MRI images to medical personnel working in the magnet room. The display can be an MRI compatible LCD projection display, a wired LCD screen display, a reflective LCD screen display or a plasma display. The display within the magnet room is made MRI compatible by appropriate shielding and filtering. The display may also display patient vital sign data or imagery from an MRI compatible ultrasound apparatus.

35 Claims, 3 Drawing Sheets

MAGNET ROOM DISPLAY OF MRI AND ULTRASOUND IMAGES

This is a continuation-in-part of applicant's pending application, Ser. No. 07/653,711, filed Feb. 11, 1991, for MAGNETIC RESONANCE IMAGING COMPATIBLE AUDIO AND VIDEO SYSTEM, the entire contents of which are incorporated by reference.

BACKGROUND OF THE INVENTION

The present invention relates to the field of magnetic resonance imaging (MRI) equipment, and more particularly to a video system including a display for displaying MRI images and patient vital sign data within a magnet room.

MRI is a relatively new scanning procedure being used in the medical community to assist doctors in various diagnostic and other procedures. The scanning procedure requires that a patient lie still inside a tunnel shaped enclosure called the bore. The MRI device uses a strong magnetic field that is generated around the patient's body. Disturbances in the field due to the presence of the body can be detected and translated into images displayed on a viewing screen.

The MRI device includes a large magnet that induces a strong, uniform, and static magnetic field. Generally, the magnetic field ranges from 0.5 Telsa to 2.0 Telsa inside the bore. Gradient coils disposed around the bore induce spatially variant magnetic fields (i.e. gradients) that modify the existing uniform magnetic field. To induce nuclear resonance, a transmitter emits radio waves through a coil, which couples the radio wave energy with the resonating nuclei inside the magnetic field. A receiver, also connected to the coil, receives the disrupted electromagnetic waves. The waves are filtered, amplified, and processed into visual data for viewing by an MRI techologist attending to the procedure. More detailed information regarding MRI equipment is available in a book entitled *Nuclear Magnetic Resonance*, pp. 53–66 (1st ed. 1981), the contents of which are incorporated by reference.

Typically, the MRI magnet is set up in a magnet room. The patient typically is supine on a table which fits into the magnet bore. In an adjacent room, typically known as the control room, shielded from the magnet room by a penetration panel, an MRI technologist controls the operation of the MRI equipment by a control console. The MRI image processor is set up in an adjacent computer room.

One procedure for which MRI equipment is now being used is non-invasive surgery, typically using a laser fiber device to burn tissue or cancer tumors while at the same time using the MRI device to provide images of the patient to view the effect of the laser operation on the tissue or tumor. A disadvantage is that the doctor conducting the procedure cannot view the MRI images of the patient while inside the MRI magnet room. The reason is that it is nearly impossible for a typical television, video cassette recorder or the like to operate properly in the presence of the strong magnetic fields in the magnet room, and the MRI equipment is very sensitive to high frequency RF leakage from cathode ray tube and other electronic equipment. Therefore, presently the surgeon performing the surgery has to localize the area of interest outside the magnet room using ultrasound equipment. This procedure can be very time consuming because the patient must be moved in and out of the magnet room each time the ultrasound equipment must be used. During the actual surgery when the MRI imagery is being generated, the surgeon must leave the magnet room and go to the operator console area located outside the magnet room to view the MRI images through the operator console monitor. This is also not conducive to good practice and can lengthen the operation.

For similar reasons, a conventional CRT type display for the patient's vital signs or EKG monitoring cannot be used within the MRI magnet room.

Therefore, a need presently exists for a display system permitting MRI images to be displayed to a surgeon or other medical personnel working within the MRI magnet room.

SUMMARY OF THE INVENTION

An image display system compatible with an MRI apparatus disposed within a magnet room is described, wherein MRI video image signals are provided by an MRI image processor connected to the MRI apparatus in the magnet room. An MRI compatible display responsive to the video signals is disposed within the magnet room for providing a display within the magnet room. The display includes RF and electromagnetic interference filtering to prevent noise from the display from propagating within the magnet room and affecting the quality of the MRI images. In one preferred form, the display comprises an LCD projector. Alternatively, the display may comprise a wired LCD screen, a reflective LCD screen display or a plasma display.

In accordance with another aspect of the invention, the display within the magnet room may display alternate types of imagery from alternate image sources, such as from an MRI compatible ultrasonic imaging apparatus located within the magnet room, apparatus for providing patient vital sign data and the like.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
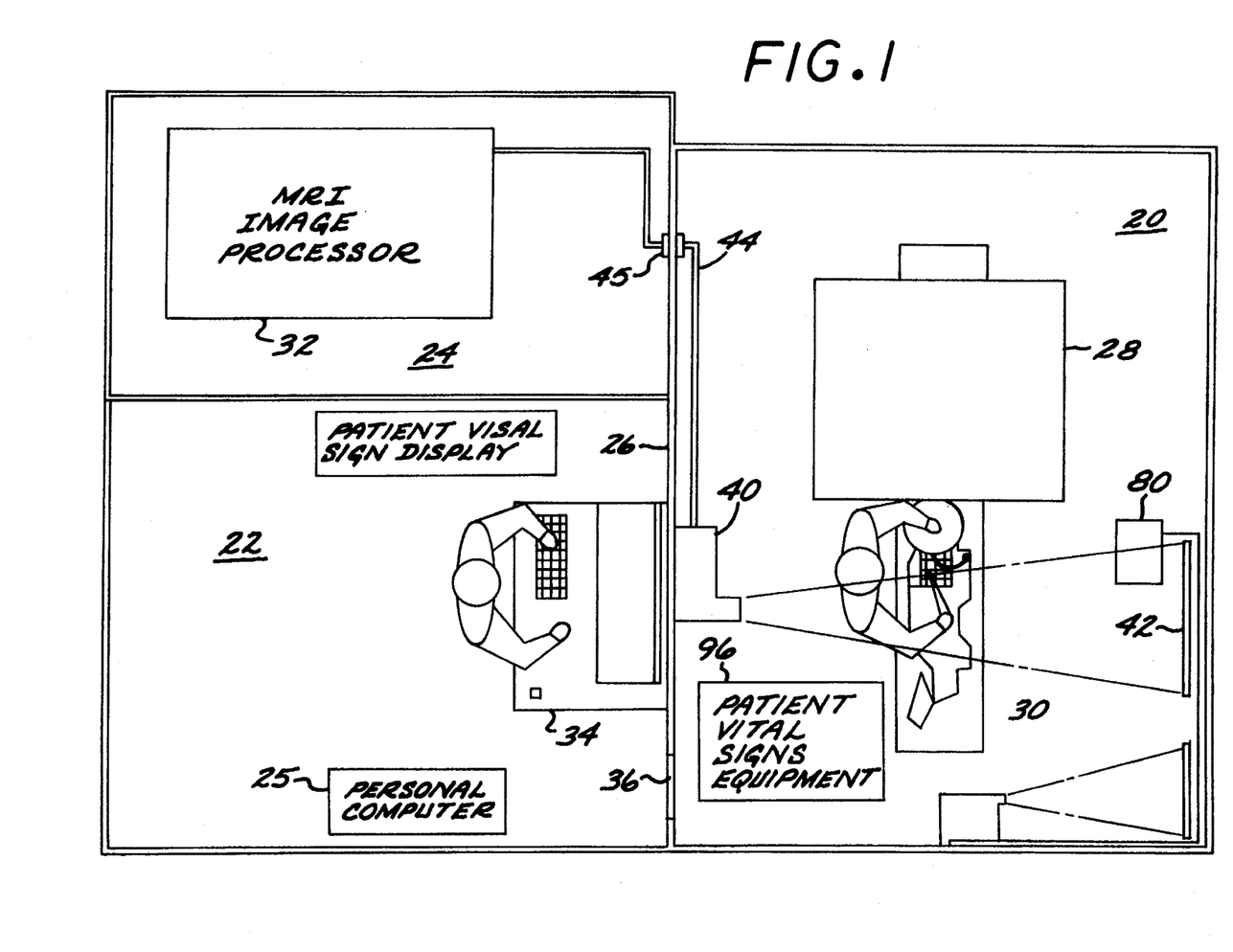
FIG. 1 is a diagrammatic schematic diagram of an MRI facility employing a display system in accordance with this invention.

FIG. 1 illustrates in schematic form an exemplary MRI apparatus embodying the invention. Physically the magnet room 20 is separated from the control room 22 and the computer room 24 by a penetration panel 26, which provides shielding for RF and magnetic signals emanating from the equipment in the respective rooms. The control and computer rooms are shown as separate rooms, although the equipment in the two rooms may alternately be combined in a single room.

The MRI magnet 28 is located in the magnet room 20, with the patient laying on the table 30, to be disposed into the magnet bore during MRI procedures. The MRI image processor 32 is in the computer room 24, and is connected to the MRI apparatus in the magnet room via connection made through the penetration panel, omitted from FIG. 1 for clarity. Connections are also made from the image processor 32 to the MRI operator console 34 in the control room 22, to allow the MRI technologist at the control console to control the operation of the MRI apparatus, and to view the MRI images generated by the image processor 32. A door 36 through the penetration panel permits egress between the control room and the magnet room.

The foregoing is descriptive of conventional MRI apparatus. To perform procedures such as non-invasive surgery on a patient with the aid of the MRI apparatus, it has been necessary in the past for the surgeon to move back and forth between the control room and the magnet room to alternatively view the MRI images on the control console display and to perform the procedure while attending the patient on the table 30.

The present invention solves this problem by providing an MRI compatible video display comprising, in this exemplary embodiment, a video projector 40 and screen 42 within the magnet room 20, permitting the surgeon to perform the procedure and view MRI images without leaving the magnet room.

A typical MRI signal is very sensitive to the electrical noise around the procession frequency of a hydrogen proton, wherein this frequency varies from 12 Mhz to 80 Mhz depending on the field strength of the magnet. Accordingly, steps are taken to block frequencies above the video frequency range, about 4.5 Mhz, in order that the video display components do not affect the MRI image quality.

The projector 40 is connected to the MRI image processor 32 by a multi-conductor cable 44 which passes through a low pass RF filter 45 disposed in the penetration panel 26 to prevent RF noise from the computer room 24 from propagating into the magnet room to adversely affect the MRI image quality. In a preferred embodiment, the filter 45 3 dB rolloff point is at 10 Mhz.

In other embodiments, the display 40 could comprise, for example, an MRI compatible reflective LCD screen display, a plasma display or other type of display which is compatible with the MRI apparatus.

Figure 2:
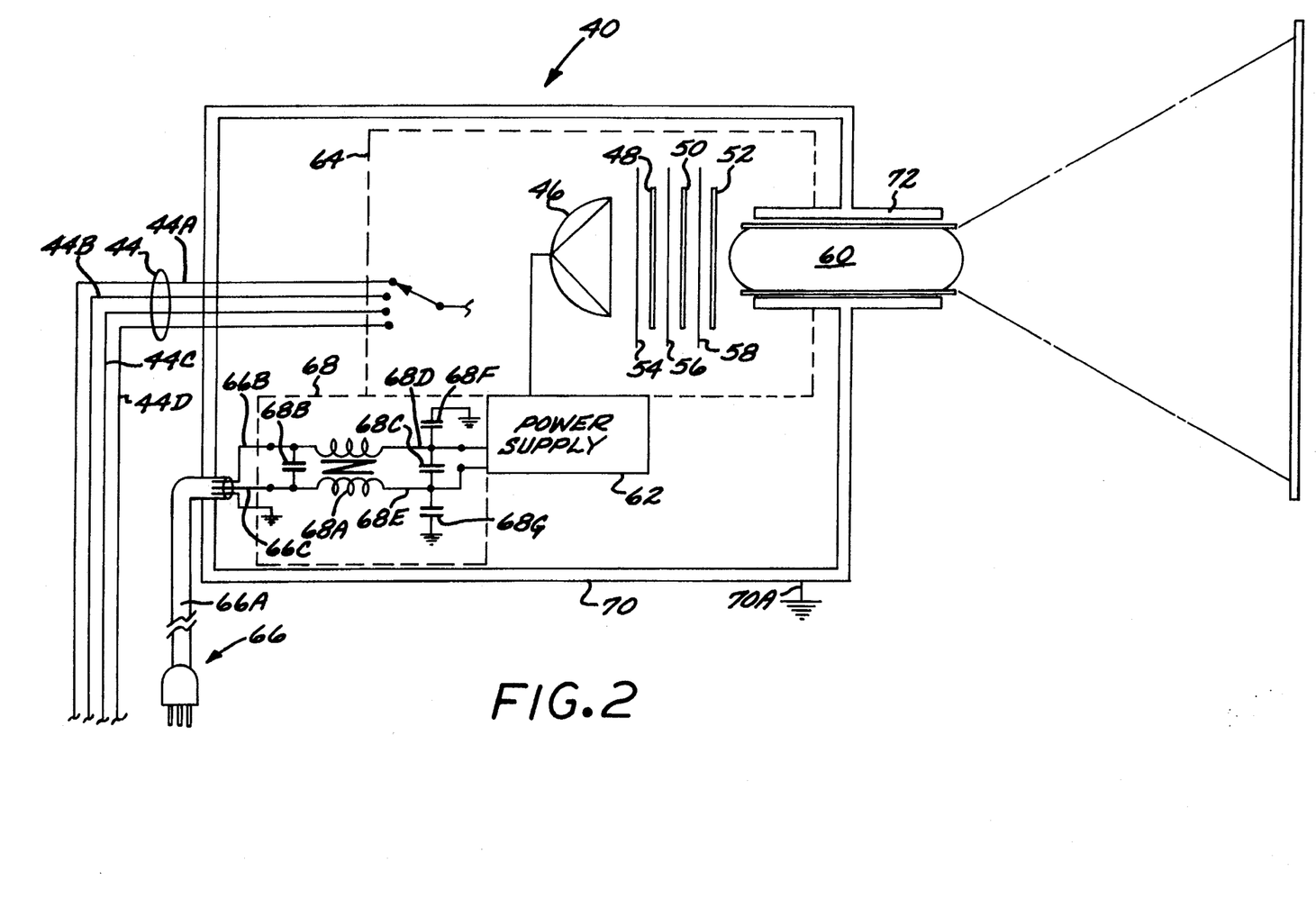
FIG. 2 is a schematic diagram of an LCD projector employed in the display system of FIG. 1.

The projector 40 is shown in further detail in the schematic diagram of FIG. 2. The projector 40 comprises a commercially available, conventional LCD projector assembly which has been modified in accordance with the invention to make the projector MRI compatible. The projector 40 includes a projector lamp assembly 46 comprising an incandescent lamp and a reflector, respective red, green and blue LCD panels 48, 50 and 52, and optical filtering and mirror optics 54, 56 and 58, and a projector zoom lens assembly 60. Element 62 represents the main power supply for the projector, and 64 indicates the outline of the projector main processor board. Each of the forgoing elements is present in the conventional LCD projector assembly. The manner in which the conventional projector is modified to make it MRI compatible will now be described.

The AC power cable 66 is encased within a braided metal RF shield 66A. An electromagnetic interference (EMI) filter 68 is provided between the shielded cable 66 and the power supply 62, to eliminate any electromagnetic noise from propagating from the projector into the magnet room and affecting MRI image quality. The filter 68 comprises, in this embodiment, a 1 MH RF choke 68A, across which are connected 0.0047 farad capacitors 68B and 68C. The output lines 68D and 68E are respectively capacitively coupled to ground by 0.0022 microfarad capacitors 68F and 68G.

The entire projector assembly is shielded by an RF shielding housing 70 made, e.g. of copper, with feedthroughs provided for the cables 42 and 66. The shielding housing is grounded by ground connection 70A.

A round elongated metallic waveguide 72 is placed about the zoom lens assembly 60 to operate as a filter to prevent high frequency energy above about 10 MHz from propagating from the projector electronics into the magnet room. In an exemplary embodiment, the waveguide 72 has a diameter of 3.5 inches and a length of about 9 inches.

The projector 40 projects imagery onto the non-magnetic screen 42, placed in a suitable location for the doctor to view while in the magnet room.

In accordance with the invention, various video input signals are provided to the projector 40 via multi-conductor cable 44. Conductor 44A provides MRI image signals from the MRI image processor 32, permitting the projector 40 to project the MRI imagery onto the screen 42. Conductor 44B provides ultrasound imagery signals from an MRI compatible ultrasound apparatus 80 located within the magnet room 20. Conductor 44C provides input signals from the computer monitor comprising console 34, to allow the doctor to view images available on the console 34, or images generated by the personal computer 25 located in the control room, which may provide images for research or diagnostic purposes, or in aid of the surgical procedure. Conductor 44D provides data to display patient vital signs, e.g. breathing, EKG, from equipment within the magnet room monitoring the condition of the patient's vital signs. A switch 76 is provided to select the desired video input to be processed and displayed by the projector 40. The switch may be positioned so that it may be operated from within the magnet room, or remotely via the control console 34.

Figure 3:
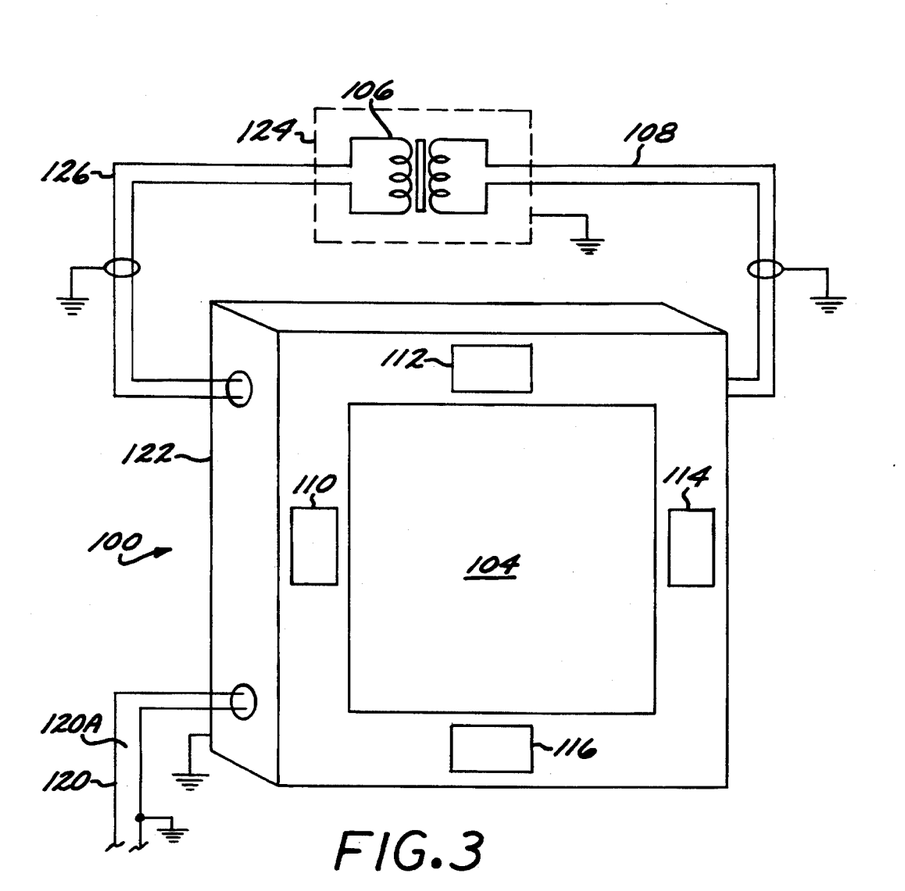
FIG. 3 is a schematic diagram of a wired LCD screen for use in the display system of FIG. 1.
Figure 4:
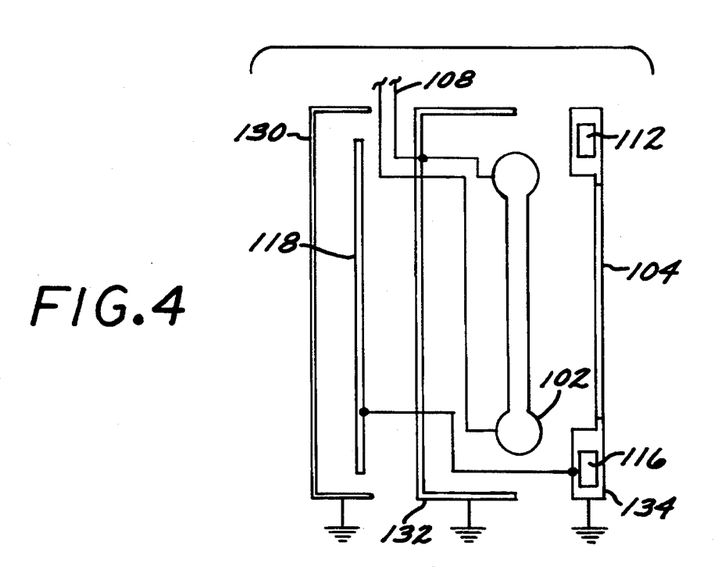
FIG. 4 is a diagrammatic side view illustrative of the components of the LCD screen of FIG. 3.

In some instances, it may be preferable to display images within the magnet room via a direct viewing display, rather than, or in addition to, images projected onto a screen. There may be strong lighting which interferes with the images projected onto a display screen, for example. FIGS. 3 and 4 illustrate a wired LCD display 100 which is modified to be MRI compatible. As in the case of the projector 40, the display 100 is a conventional, commercially available device which has been modified to be MRI compatible. This type of display requires a high biasing voltage, e.g. on the order of 300-500 volts. FIG. 4 is a diagrammatic side view of the major components of the display 100. Power and input video signals are provided to the unit via cable 120. A fluorescent lamp 102 provides the backlighting for an active matrix LCD screen 104. The lamp 102 requires the high biasing voltage, and is connected to a high voltage power supply via cabling 108. The display is controlled by four LCD driver integrated circuit chips 110, 112, 114 and 116 located along each side of the rectangular screen 104, as shown diagrammatically in FIG. 3. The driver circuits are connected to a main processor board 118, and are controlled by the processor board in response to externally provided image control signals to provide a display. The foregoing components exist on the conventional LCD wired display. The manner in which the conventional display is modified to make it MRI compatible will now be described.

The power and video input signal cable 120 is shielded by a braided metallic shield, which is grounded, to eliminate any interference with the MRI image quality.

The device 100 is enclosed within a shielded housing 122 made of copper or the like, with an opening for the LCD screen 104. The housing is grounded.

The power supply 106 is removed from within the housing of the device, as in the conventional display device, and located some distance away, so that it is not within the strong magnetic field adjacent the magnet 28. The power supply includes a transformer which if subjected to powerful magnetic fields could be damaged. The power supply 106 is placed within a shielded housing or box 124, and shielded cables 126 and 108 run from the main processor board 118 and the lamp 102 to the power supply 106. The shielding on both cables 126 and 108 is grounded. The power supply 106 includes a transformer for converting the low voltage power operating the main processor board 118 to the relatively high voltage required to operate the lamp 102. Typically, the power supply 106 will be located some twenty or thirty feet away from the strong magnetic field of the MRI apparatus to avoid interference. Typically, the power supply can be placed in a corner of the magnet room where the magnetic fields are not strong, or alternatively the power supply may be moved into the computer room by use of RF shielding in the manner of the cable 44.

The main processor board 118 is further shielded by shielding 130 which extends about the sides of the board 118 and along the surface of the board facing away from the LCD panel 104. The shielding may be fabricated of copper sheeting. The shielding 130 is grounded.

Additional shielding 132, e.g. copper sheeting, is provided for the lamp 102 and the driver circuits, and extends between the lamp 104 and the board 118, and along the sides. The shielding 132 is also grounded. The circuits 110, 112, 114 and 116 are virtually enclosed by additional copper sheeting 134 which is grounded. This sheeting 134 is to prevent RF leakage from leaking out into the magnet room to adversely affect the image quality.

The system further includes an MRI compatible ultrasonic apparatus 80, connected to the display 40, or alternatively to a second video display located within the magnet room, for example, a second projector 90 for viewing of ultrasonic images on a second screen 92. The second projector 90 can also be used to provide a display of imagery for the patient, e.g. entertainment imagery, in the manner described in the referenced patent application. MRI compatible ultrasonic apparatus are commercially available from the General Electric Company.

The system further includes apparatus 96 located within the magnet room for monitoring the patient's vital signs, such as breathing, EKG, and the like. Such equipment provide data signals which can be provided either directly to the display 40 or 90, or through conventional video processing equipment to the projector, to provide one of the inputs to the projector. One such commercially available patient vital sign monitoring equipment is the Hewlett-Packard Company model HP 78351A EKG equipment. Other types of monitoring equipment include peripheral gating devices, wherein a lead is attached to the patient's finger, breathing compensation monitoring devices and the like. Some apparatus monitor several patient vital signs simultaneously. These apparatus provide data which may be processed for display on the display 40 or 90, for example.

The invention permits the surgeon to perform such procedures as non-invasive laser surgeries with the aid of MRI ultrasonic imaging without having to move to and from the patient in the magnet room and the display in the control room. In a typical procedure, the surgeon localizes the area of the patient's body which is to be the subject of the procedure, i.e. which part of the patient's anatomy is to be burned with a laser/optical fiber tool, with the patient's body outside the magnet bore. The ultrasound images are displayed on the display 40 or 150. The operating end of the optical fiber is then inserted into the localized area by the surgeon with the aid of the ultrasound images displayed within the magnet room. The patient's body can then be moved into the magnet bore in position for the MRI processing. With the MRI images of the localized area being displayed on the display screen 42 and observed by the surgeon, the laser can be pulsed or activated, and the results of the procedure can be observed on the display screen 42. The laser procedure can be adjusted or terminated with the aid of the MRI images, without the surgeon having to periodically go to and from the control room to see the display there. The time required for the procedure can therefore be reduced.

Another use for the display described above is in employing MRI techniques to visualize the propagation of neural activation in the brain (or accompanying physiological changes). In order to stimulate the brain, there is a need for visual stimulation that can be used in the magnetic field, and which fills up all the field of view for the patient. An LCD display can be used, by placing an LCD display such as an MRI compatible LCD TV screen, at the end of the patent table 30, and by using mirrors within the magnet bore with proper optics to direct the images inside the magnet bore for viewing by the patient within the bore. The LCD TV display can be easily interfaced to a computer or any video source to send different graphs or image patterns to the magnet room for viewing by the patient. The MRI apparatus can then be used to provide MRI images of the brain to visualize neural activation of the brain in response to the viewed visual stimulation.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A display system compatible with a magnetic resonance imaging (MRI) apparatus disposed in a magnet room, the system comprising:
   means for providing MRI image video signals;
   an MRI-compatible display means responsive to said video signals and disposed within said magnet room for providing a display within said magnet room, said display means including RF and electromagnetic interference filtering means to prevent noise from said display means from affecting the quality of the images produced by said MRI apparatus.

2. The display system of claim 1 wherein said display means comprises a liquid crystal display (LCD) projector and a non-magnetic display screen located within said magnet room.

3. The display of claim 2 wherein said projector comprises a housing shield for containing the electronic components of said display and shielding against the propagation of RF noise from components within said housing shield to said magnet room.

4. The display of claim 3 wherein said projector comprises an optical lens for focussing light projected by said projector, and further including a metallic waveguide within which said lens is disposed, said waveguide extending from within said projector housing over the extent of said lens and comprising filter means for shielding against propagation of RF energy above about 10 MHz in frequency out said housing through said lens.

5. The display of claim 2 wherein said projector further comprises an ac power cable, said cable being provided with grounded RF shielding.

6. The display of claim 2 wherein said projector comprises a power supply connected to a source of electrical energy, said projector further comprising an electromagnetic filter connected between said source and said power supply.

7. The display of claim 1 wherein said display is further responsive to an alternate source of video image signals illustrative of an alternate image type, and said display further includes a means for selecting whether the display means is displaying said MRI images or said alternate image.

8. The display of claim 7 wherein said selecting means comprises a switch.

9. The display of claim 7 wherein said alternate source of video image signals is apparatus for providing patient vital sign data.

10. The display of claim 9 wherein said patient vital sign apparatus comprises EKG apparatus.

11. The display of claim 9 wherein said patient vital sign apparatus comprises apparatus for monitoring patient breathing signs.

12. The display of claim 7 wherein said alternate source of video image signals comprises MRI compatible ultrasonic imaging apparatus located within said magnet room.

13. The display of claim 1 wherein said display means comprises an LCD screen display device.

14. The display of claim 13 wherein said screen display device comprises a wired LCD screen.

15. The display of claim 13 wherein said screen display device includes a fluorescent light source powered by a high voltage power supply.

16. The display of claim 14 wherein said screen display device further includes a display housing shield and a high voltage power supply means located physically outside said shield but within said magnet room in a location where there is no strong magnetic field.

17. The display of claim 16 further comprising RF shielded cabling connecting said housing shield and said power supply means.

18. The display of claim 13 wherein said LCD screen display comprises LCD driver circuitry, and RF shielding means enclosing said driver circuitry for preventing unwanted propagation of RF noise into said magnet room.

19. An image display system compatible with a magnetic resonance imaging (MRI) apparatus disposed in a control room and a magnet room separated by a penetration panel, wherein the magnet room contains a main magnet having a bore, the system comprising:

means for providing MRI image video signals, located within said control room;

an MRI-compatible display means disposed within said magnet room for providing a display within said magnet room, said display means including RF and electromagnetic interference filtering means to prevent noise from said display means from affecting the quality of the images produced by said MRI apparatus; and means for conducting said image video signals through said penetration panel to said MRI-compatible display means located within said magnet room, said means including means for filtering said image display video signals for RF and high frequency energy.

20. The display system of claim 19 wherein said display means comprises a liquid crystal display (LCD) projector and a non-magnetic display screen located within said magnet room.

21. The display of claim 20 wherein said projector comprises a housing shield for containing the electronic components of said display.

22. The display of claim 20 wherein said projector comprises an ac power cable passed through said penetration panel to a source of ac power, a power supply operating on ac power, and an electromagnetic interference filter for coupling said ac power to said power supply, said filter for preventing electromagnetic noise energy from passing from said projector outwardly into said magnet room and thereby affecting said image quality.

23. A display system compatible with a magnetic resonance imaging (MRI) apparatus disposed in a magnet room, the system comprising:

means for providing data signals representative of a vital sign of a patient located within said magnet room;

an MRI-compatible display means responsive to said data signals and disposed within said magnet room for providing a visual display within said magnet room illustrative of said patient vital sign, said display means including RF and electromagnetic interference filtering means to prevent noise from said display means from adversely affecting the quality of images produced by said MRI apparatus.

24. The system of claim 23 wherein said means for providing data signals comprises an electrocardiogram sensing means.

25. The system of claim 23 wherein said means for providing data signals comprises means for providing patient breathing data.

26. The system of claim 23 wherein said means for providing data signals comprises peripheral gating means coupled to the patient.

27. The system of claim 23 wherein said display means comprises LCD projection means.

28. The system of claim 23 wherein said display comprises a plasma display apparatus.

29. The system of claim 23 wherein said display comprises a wired LCD display system.

30. The system of claim 23 wherein said display comprises a reflective LCD display system.

31. A display system compatible with a magnetic resonance imaging (MRI) apparatus disposed in a magnet room, the system comprising:

an MRI compatible ultrasonic imaging system disposed within said magnet room for providing ultrasonic image signals of a patient within said magnet room;

an MRI-compatible display means responsive to said ultrasonic image signals and disposed within said magnet room for providing an ultrasonic image display within said magnet room, said display means including RF and electromagnetic interference filtering means to prevent noise from said display means from affecting the quality of the images produced by said MRI apparatus.

32. The display of claim 31 wherein said display means comprises an LCD projector for projecting images onto a non-magnetic screen disposed within said room.

33. The display of claim 3 wherein said display means comprises a wired LCD screen display.

34. The display of claim 31 wherein said display means comprises a plasma display means.

35. The display of claim 3 wherein said display means comprises a reflective LCD display means.

* * * * *

EX PARTE REEXAMINATION CERTIFICATE (5496th)

United States Patent
Ziarati (10) Number: US 5,432,544 C1
(45) Certificate Issued: *Sep. 12, 2006

(54) MAGNET ROOM DISPLAY OF MRI AND ULTRASOUND IMAGES

(75) Inventor: Mokhtar Ziarati, North Hollywood, CA (US)

(73) Assignee: Resonance Technology, Inc., Van Nuys, CA (US)

Reexamination Request:
No. 90/004,834, Nov. 12, 1997

Reexamination Certificate for:
Patent No.: 5,432,544
Issued: Jul. 11, 1995
Appl. No.: 07/997,957
Filed: Dec. 21, 1992

(*) Notice: This patent is subject to a terminal disclaimer.

Related U.S. Application Data

(63) Continuation-in-part of application No. 07/653,711, filed on Feb. 11, 1991, now Pat. No. 5,412,419.

(51) Int. Cl.
*H04N 7/18* (2006.01)

(52) U.S. Cl. .................... 600/410; 600/425; 324/318; 348/77

(58) Field of Classification Search ............. 348/77, 348/61, 82, 552, 739, 744; 600/410, 425; 324/318
See application file for complete search history.

(56) References Cited

U.S. PATENT DOCUMENTS

| | | | |
|---|---|---|---|
| 4,347,911 A | 9/1982 | Bertagna et al. | |
| 4,595,260 A | 6/1986 | Kubota | |
| 4,613,820 A | 9/1986 | Edelstein | 324/318 |
| 4,663,670 A | 5/1987 | Ito et al. | |
| 4,701,952 A | 10/1987 | Taylor | 381/25 |
| 4,710,591 A * | 12/1987 | Rochester, Jr. | 348/836 |
| 4,824,210 A | 4/1989 | Shimazaki | |
| 4,855,910 A | 8/1989 | Bohning | |
| 4,861,142 A | 8/1989 | Tanaka et al. | |
| 4,864,192 A | 9/1989 | Buchwald et al. | |
| 4,901,141 A | 2/1990 | Costello | |
| 4,903,703 A | 2/1990 | Igarashi et al. | |
| 4,923,295 A | 5/1990 | Sirewl et al. | |
| 4,928,123 A | 5/1990 | Takafuji | |
| 4,933,981 A | 6/1990 | Lederer | |
| 4,972,836 A | 11/1990 | Schenck et al. | |
| 4,981,137 A | 1/1991 | Kondo et al. | |
| 4,991,580 A | 2/1991 | Moore | |
| 4,991,587 A | 2/1991 | Blakely et al. | |
| 5,022,397 A | 6/1991 | Dumoulin | |
| 5,038,785 A | 8/1991 | Blakely et al. | |

(Continued)

FOREIGN PATENT DOCUMENTS

| | | |
|---|---|---|
| DE | 37 08 518 | 9/1988 |
| DE | 38 44 482 | 2/1990 |
| EP | 01 57 404 | 10/1985 |
| WO | WO 90/07301 | 7/1990 |

OTHER PUBLICATIONS

Transcript of Aug. 11, 1997 Hearing in *Resonance Technology, Inc. v. Siemens Medical Systems, Inc.*, No. CV–97–0788–GHK (C.D. Cal.).

(Continued)

*Primary Examiner*—Michael H. Lee (57) ABSTRACT

A display system for display of MRI, ultrasonic, patient vital sign or other imagery within a magnet room of an MRI system. An MRI compatible video display is disposed with the magnet room, and is connected to the MRI image processor to provide MRI images to medical personnel working in the magnet room. The display can be an MRI compatible LCD projection display, a wired LCD screen display, a reflective LCD screen display or a plasma display. The display within the magnet room is made MRI compatible by appropriate shielding and filtering. The display may also display patient vital sign data or imagery from an MRI compatible ultrasound apparatus.

U.S. PATENT DOCUMENTS

| | | | |
|---|---|---|---|
| 5,076,275 A | | 12/1991 | Becher et al. |
| 5,101,139 A | | 3/1992 | Lechter |
| 5,134,373 A | | 7/1992 | Tsuruno et al. |
| 5,146,924 A | * | 9/1992 | Sepponen ............... 128/653.2 |
| 5,172,103 A | | 12/1992 | Kita |
| 5,184,074 A | | 2/1993 | Kaufman et al. |
| 5,214,522 A | | 5/1993 | Tagawa |
| 5,239,265 A | | 8/1993 | Sugahara |
| 5,265,273 A | * | 11/1993 | Goodwin et al. ........... 455/347 |
| 5,394,873 A | | 3/1995 | Kraemer et al. |

OTHER PUBLICATIONS

S.J. Karlik et al., "Patient Anesthesia and Monitoring at a 1.5–T MRI Installation," 7 Magnetic Resonance in Med. at 210–221 (1988).

Rokey et al., "Monitoring of Acutely Ill Patients During Nuclear Magnetic Resonance Imaging: Using a Time Varying Filler Electrocardiographic Gating Device to Reduce Gradient Artifact," 6 Magnetic Resonance in Med. at 240–245 (1988).

Gerald E. Jones, "DMM Protection Features," *Computer/Electronic News Service*, Jun. 1985.

Allan Stephan, "Digital Multimeter Packaging Tackles Harsh Environment," Electronic Packaging and Production, Oct. 1984.

Tak Tsang, "Fluke 25/27 and 8025A: The Best in EMI Shielding;" 1085 Fluke Scoop, Oct. 1985.

Stephen A. Magnus, "When High–end Instruments will Shun CRTs; Flat–panel Displays," EDN (Sep. 7, 1989).

Peter McAtamney and Derek Shaw, "Siting and Installation," Chapter 2 of *Practical NMR Imaging*, pp. 49–79 (1987).

Invivo Research Inc. MRI Vital Signs Monitoring Product Line, 1988.

Declaration of Mokhtar Ziarati of Apr. 28, 1994 submitted in *Magnacoustics, Inc. v. Resonance Technology Co. et al.,* Case No. CV–93–1052–JSL (Ex).

Deposition of Mokhtar Ziarati, Jun. 4, 1997, *Resonance Technology, Inc. v. Siemens Medical Systems, Inc.,* No. 97–0788 GHK (Ctx).

Declaration of John Villasenor, Jul. 14, 1997, *Resonance Technology, Inc. v. Siemens Medical Systems, Inc.,* No. 97–0788 GHK (Ctx).

Deposition of John David Villasenor, Jun. 6, 1997, *Resonance Technology, Inc. v. Siemens Medical Systems, Inc.* No. 97–0788 (GHK (C.Tx.).

AAPM, Site Planning for Magnetic Resonance Imaging Systems, Dec. 1986.

Michael R. Lindeburg, Engineer–In–Training Reference Manual, p. 48–13, 1990.

Declaration of Mokhtar Ziarati dated Aug. 29, 1991, U.S. Appl. No. 07/653,711.

U.S. Appl. No. 07/653,711, filed Feb. 11, 1991.

Declaration of Mohktar Ziarati dated Nov. 8, 1993, U.S. Appl. No. 07/997,957.

Disclosure Document 251512.

Preliminary Statement of Party Ziarati, *Ziarati v. Bechor et al.,* Interference No. 103,015.

"Television Comes to MRI Scanner," *Advance for Radiologic Science Professionals,* p. 10 (Jan. 14, 1991).

Declaration of Mokhtar Ziarati dated Mar. 19, 1993, *Ziarati v. Bechor et al.,* Interference No. 103,105, with exhibit.

Einstein and Hilal, "Site Planning and Design: Influences and Implementation," *Magnetic Resonance Annual,* p. 307–08, 1985.

McArdle, "MRI helps detect injury in neonatal, infant brain," *Diagnostic Imaging,* 1987.

White, "A Handbook on EMI Control Methods and Techniques," Chapters 11 and 12, 1973.

White, "Shielding Design—Methodology and Procedures," Chapter 4, "Aperture Leakages and Their Control," Chapters 6, 12, 1986.

Notice of Prior Art Pursuan to 35 U.S.C. Section 282 filed in Case No. CV–97–0788–GHK (Ctx), dated Feb. 19, 1998.

Declaration of Donald R. J. White filed in Case No. CV–97–0788–GHK (Ctx), 1997.

Declaration of Roger E. Susi filed in Case No. CV–97–0788–GHK (Ctx) (including alleged materials from Invivo Research), 1997.

Second Declaration of Donald R. J. White filed in Case No. CV–97–0788–GHK (Ctx), 1997.

Declaration of Mokhtar Ziarati filed in Case No. C–93–1052–JSL (Ex).

Declaration of John Villasenor, dated Apr. 10, 1997, filed in Case No. CV–97–0788–GHK (Ctx).

Declaration of John Villasenor, dated Jul. 14, 1997, filed in Case No. CV–97–0788–GHK (Ctx).

Expert report of Barry E. Bretschneider filed in Case No. CV–97–0788–GHK (Ctx).

Expert report of Donald R. J. White filed in Case No. CV–97–0788–GHK (Ctx).

Deposition of Barry E. Bretschneider in Case No. CV–97–0788–GHK (Ctx).

\* cited by examiner

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 7–12, 15, 31, 32 and 34 is confirmed.

Claims 1–6, 13, 14, 16–30, 33 and 35 are cancelled.

\* \* \* \* \*